United States Patent
Maeda

[11] Patent Number: 6,117,609
[45] Date of Patent: Sep. 12, 2000

[54] PHOTOSENSITIVE RECORDING MATERIAL USING MICROCAPSULES

[75] Inventor: Minobu Maeda, Kounan, Japan

[73] Assignee: Brother Kogyo Kabushiki Kaisha, Nagoya, Japan

[21] Appl. No.: 09/079,366

[22] Filed: May 15, 1998

[30] Foreign Application Priority Data

May 21, 1997 [JP] Japan ..................................... 9-130813

[51] Int. Cl.[7] .................................................. G03C 1/725
[52] U.S. Cl. ........................ 430/138; 430/281.1; 430/921; 430/926
[58] Field of Search ................................. 430/281.1, 138, 430/921, 926

[56] References Cited

U.S. PATENT DOCUMENTS

| | | | |
|---|---|---|---|
| 2,800,457 | 7/1957 | Green et al. | 252/316 |
| 2,800,458 | 7/1957 | Green | 252/316 |
| 4,089,802 | 5/1978 | Foris et al. | 252/316 |
| 4,116,788 | 9/1978 | Schmitt et al. | 204/159.23 |
| 4,283,481 | 8/1981 | Okai et al. | 430/271 |
| 4,289,844 | 9/1981 | Specht et al. | 430/281 |
| 4,522,693 | 6/1985 | Henne et al. | 204/159.15 |
| 4,576,891 | 3/1986 | Adair et al. | 430/138 |
| 4,868,091 | 9/1989 | Boettcher et al. | 430/281 |
| 4,940,645 | 7/1990 | Davis et al. | 430/438 |
| 5,055,372 | 10/1991 | Shanklin et al. | 430/138 |
| 5,100,756 | 3/1992 | Kobayashi | 430/138 |
| 5,124,236 | 6/1992 | Yamaguchi et al. | 430/281 |
| 5,686,220 | 11/1997 | Tsuda et al. | 430/138 |

FOREIGN PATENT DOCUMENTS

| | | |
|---|---|---|
| 0 223 587 | 5/1987 | European Pat. Off. . |
| 0 523 565 | 1/1993 | European Pat. Off. . |
| 0 560 724 | 9/1993 | European Pat. Off. . |
| 36-9168 | 6/1936 | Japan . |
| 38-19574 | 9/1938 | Japan . |
| 42-446 | 1/1942 | Japan . |
| 42-771 | 1/1942 | Japan . |
| 51-9079 | 1/1976 | Japan . |
| 57-124343 | 8/1982 | Japan . |
| 952 807 | 3/1964 | United Kingdom . |
| 965 074 | 7/1964 | United Kingdom . |

*Primary Examiner*—Janet Baxter
*Assistant Examiner*—Rosemary Ashton
*Attorney, Agent, or Firm*—Oliff & Berridge, PLC

[57] ABSTRACT

A photosensitive recording material comprises a support and microcapsules provided thereon, wherein the microcapsules comprises a photopolymerizable unsaturated group-containing compound and a phosphine compound represented by the following general formula:

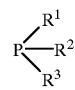

where $R^1$, $R^2$ and $R^3$ indicate a hydrogen atom, a $C_1$ to $C_{20}$ alkyl, aryl or aralkyl group, $-OR^4$, or $-SR^4$ where $R^4$ indicates a hydrogen atom or a $C_1$ to $C_{20}$ alkyl, aryl or aralkyl group, and these may be substituted by a halogen atom or a $C_1$ to $C_{20}$ alkoxy, alkoxycarbonyl, acyloxy, alkanoyl, cyano, hydroxy or amino group.

19 Claims, No Drawings

PHOTOSENSITIVE RECORDING MATERIAL USING MICROCAPSULES

BACKGROUND OF THE INVENTION

1. Field of the Invention

The present invention relates to a photosensitive recording material using microcapsules, and in particular to a photosensitive recording material using microcapsules that contain core materials in a specific combination.

2. Related Art of the Invention

Conventional photosensitive recording materials, such as that disclosed in Japanese Patent Application Laid-Open No. 57-124343, have been used as recording materials in which microcapsules are supported on a recording medium such as paper or the like.

In such photosensitive recording materials, the microcapsules are commonly applied over the entire surface of the recording medium, the surface of the photosensitive recording material is exposed to form a latent image based on the image that is to be recorded, and the recording medium on which the latent image has been formed is pressurized to visualize and record the image.

That is, the microcapsules harden in the portions that is exposed, but do not harden in the unexposed portions, and since the capsules themselves are not destroyed by pressure in the portions where the microcapsules have hardened, they do not colorize in the portions where they have hardened when the recording medium on which the latent image has been formed is pressurized by a pressurization device, while the microcapsules are destroyed according to the wavelength of the exposure light in the portions where the capsules have not hardened, resulting in the development of color by a coloring reaction.

However, a problem in conventional photosensitive recording materials using microcapsules is that the microcapsules sometimes do not harden sufficiently when exposed, and even those which are known to be highly sensitive do not harden sufficiently.

Although there are methods for increasing the radiation energy of the exposure or the exposure time to ensure that the aforementioned photosensitive recording material is sufficiently hardened, a problem is the resulting increase in the size and cost of the exposure equipment.

SUMMARY OF THE INVENTION

An object of the present invention is to remedy the aforementioned drawbacks by providing a photosensitive recording material in which microcapsules can be sufficiently hardened with low energy, and which is capable of forming clear images with good tone and no smearing.

To achieve this object, the present invention provides a photosensitive recording material comprising a support and microcapsules provided thereon, wherein the microcapsules comprises a photopolymerizable unsaturated group-containing compound and a phosphine compound represented by the following general formula:

where $R^1$, $R^2$ and $R^3$ indicate a hydrogen atom, a $C_1$ to $C_{20}$ alkyl, aryl or aralkyl group, $-OR^4$, or $-SR^4$ where $R^4$ indicates a hydrogen atom or a $C_1$ to $C_{20}$ alkyl, aryl or aralkyl group, and these may be substituted by a halogen atom or a $C_1$ to $C_{20}$ alkoxy, alkoxycarbonyl, acyloxy, alkanoyl, cyano, hydroxy or amino group.

According to the photosensitive recording material of the present invention in which the microcapsules comprise the photopolymerizable unsaturated group-containing compound and the phosphine compound represented by the aforementioned general formula, the microcapsules are allowed to be sufficiently hardened with low energy, and clear images are also allowed to be formed with good tone and no smearing.

In the photosensitive recording material of the present invention, the photopolymerizable unsaturated group-containing compound is preferably a polymerizable compound having at least one ethylenic unsaturated double bond. This allows the microcapsules to be sufficiently cured rapidly, and clear images with good tone and no smearing to be formed.

In the photosensitive recording material of the present invention, it is preferably that the phosphine compound is contained in an amount of from 0.01 to 20 wt %. This allows the microcapsules to be sufficiently cured rapidly with low energy, and clear images with good tone and no smearing to be formed.

This and other objects, features and advantages of the present invention are described in or will become apparent from the following detailed description of the invention.

DETAILED DESCRIPTION OF THE INVENTION

The photosensitive recording material of the present invention comprises a support and microcapsules provided thereon, where the microcapsules comprises a photopolymerizable unsaturated group-containing compound and a phosphine compound.

Examples of the aforementioned photopolymerizable unsaturated group-containing compound include compounds having ethylenic unsaturated groups and compounds having epoxy groups. The compounds having ethylenic unsaturated groups with a relatively fast velocity of photopolymerization are especially preferred.

Examples of the compounds having ethylenic unsaturated groups include acrylic acid and salts thereof, acrylic acid esters, acrylamide, methacrylic acid and salts thereof, methacrylic acid esters, methacrylamides, maleic anhydride, maleic anhydride esters, itaconic acid esters, styrenes, vinyl ethers, vinyl esters, N-vinyl heterocycles, allyl ethers, allyl esters, and derivatives thereof. Of these, acrylic acid esters or methacrylic acid esters with a relatively rapid degree of photopolymerization are especially preferred.

Specific examples of acrylic acid esters include butyl acrylate, cyclohexyl acrylate, ethylhexyl acrylate, benzyl acrylate, furfuryl acrylate, ethoxyethyl acrylate, tricyclodecanyloxy acrylate, nonylphenyloxyethyl arylate, hexanediol acrylate, 1,3-dioxolan acrylate, hexanediol diacrylate, butanediol diacrylate, neopentyl glycol diacrylate, polyethylene glycol diacrylate, tricyclodecane dimethylol diacrylate, tripropylene glycol diacrylate, bisphenol A diacrylate, pentaerythritol triacrylate, dipentaerythritol hexacrylate, dipentaerythritol caprolactone-adduct hexacrylate, trimethylol propane triacrylate, trimethylol propane propylene oxide-adduct triacrylate, polyoxyethylenated bisphenol A diacrylate, polyester acrylate, and polyurethane acrylate.

Examples of methacrylic acid esters include butyl methacrylate, cyclohexyl methacrylate, ethylhexyl methacrylate, benzyl methacrylate, furfuryl methacrylate, ethoxyethyl methacrylate, tricyclodecanyloxy methacrylate, nonylphenyloxyethyl methacrylate, hexanediol methacrylate, 1,3-dioxolan methacrylate, hexanediol dimethacrylate, butanediol dimethacrylate, neopentyl glycol dimethacrylate, polyethylene glycol dimethacrylate, tricyclodecane dimethylol dimethacrylate, tripropylene glycol dimethacrylate, bisphenol A dimethacrylate, pentaerythritol trimethacrylate, dipentaerythritol hexamethacrylate, dipentaerythritol caprolactone-adduct hexamethacrylate, trimethylol propane trimethacrylate, trimethylol propane propylene oxide-adduct trimethacrylate, polyoxyethylenated bisphenol A dimethacrylate, polyester methacrylate, and polyurethane methacrylate.

These polymerizable compounds may be used individually or in combinations of two or more.

The aforementioned acrylic acid esters or methacrylic acid esters preferably contains at least one of pentaerythritol triacrylate, dipentaerythritol hexacrylate, dipentaerythritol caprolactone-adduct hexacrylate, trimethylol propane triacrylate, and trimethylol propane propylene oxide-adduct triacrylate, which have three or more aryloyl groups, which are unsaturated groups, per molecule.

The photopolymerizable unsaturated group-containing compound also contains the phosphine compound represented by the following general formula:

where $R^1$, $R^2$ and $R^3$ indicate a hydrogen atom, a $C_1$ to $C_{20}$ alkyl, aryl or aralkyl group, —$OR^4$, or —$SR^4$ where $R^4$ indicates a hydrogen atom or a $C_1$ to $C_{20}$ alkyl, aryl or aralkyl group, and these may be substituted by a halogen atom or a $C_1$ to $C_{20}$ alkoxy, alkoxycarbonyl, acyloxy, alkanoyl, cyano, hydroxy or amino group.

Examples of phosphine compounds include phosphate esters, phosphite esters, thiophosphate esters, thiophosphite esters, and derivatives thereof. Of these, thiophosphite derivatives with high sensitivity to light and good hardening properties are especially preferred.

The phosphine compound is added in an amount of 0.01 to 20 wt %, and preferably 0.5 to 10 wt %, with respect to the photopolymerizable unsaturated group-containing compound. Less than 0.01 wt % results in poor improvement, while more than 20 wt % results in extremely poor storage stability.

The photosensitive recording material of the present invention may contain a photopolymerization initiator, a photosensitizer such as a sensitizing colorant, a stabilizer such as a heat polymerization inhibitor, compatibility improving agent, a pigment or the like in addition to the aforementioned essential components. A highly sensitive photosensitive material can be obtained when a photopolymerization initiator or photosensitizer is added.

As the photopolymerization initiator, aromatic carbonyl compounds, acetophenones, organic peroxides, diphenylhalonium salts, organic halides, 2,4,6-substituted-S-triazines, 2,4,5-triarylimidazole dimers, azo compounds, dye borate complexes, metal arene complexes, titanocene compounds and the like can be used, which initiates or promotes the polymerization reaction of the aforementioned polymerizable material through light energy.

Specifically as the photopolymerization initiator, benzophenone, benzil, xanthone, thioxanthone, anthraquinone, acetophenone, 2,2-dimethl-2-morpholino-4'-methylthioacetophenone, benzoyl peroxide, 3,3',4,4'-tetrakis(t-butyldioxycarbonyl)benzophenone, diphenyl iodonium bromide, diphenyl iodonium chloride, carbon tetrachloride, carbon tetrabromide, 2,4,6-tristrichloromethyl-S-triazine, ($\eta^5$-2,4-cyclopentadien-1-yl)[(1,2,3,4,5,6-$\eta$)-(1-ethylethyl)benzene]iron(1+)hexafluorophosphate(1−), and the like are preferred. These photopolymerization initiator may be used individually or in combinations of two or more.

The photopolymerization initiator is used in a ratio of 0.1 to 20 wt %, and preferably 1 to 10 wt %, with respect to the polymerizable material. Less than 1% ordinarily makes it difficult to produce a photopolymerization reaction, while more than 10% does not increase the sensitivity.

A sensitizing colorant may also be used to improve the photosensitivity, particularly the photosensitivity to wavelength, of the aforementioned photosensitive recording material.

As the sensitizing colorant, Xanthene dyes, coumarin dyes, mellocyanine dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes, and the like can be used.

Pigments can be used as a coloring material. Those of suitable hue may be selected from those that are commercially available as well as those listed in Pigments manuals or other such documents (such as New Pigment Manual [Saishin Ganryo Benran], compiled by Nihon Ganryo Gijutsu Kyokai and published in 1977) in the literature, and are dispersed for use.

The use of monoazos, disazos, azocalcium Lake, and azobarium Lake for yellow, of quinacridone and calcium Lake for magenta, and of phthalocyanine and the like for cyan, is particularly preferred.

Organic solvents having suitable polarity can also be used to adjust the solubility of the composition encapsulated in the microcapsules of the present invention.

Such microcapsules can be manufactured using encapsulation methods which are already well known techniques in the field. Examples of the methods include phase separation methods from aqueous solutions such as those disclosed in U. S. Pat. Nos. 2,800,457 and 2,800,458, interfacial polymerization methods such as that disclosed in Japanese Patent Publications No. 38-19574, 42-446, and 42-771, in-situ methods based on the polymerization of monomers such as those disclosed in Japanese Patent Publication No. 36-9168 and Japanese Patent Application Laid-Open No. 51-9079, and catalytic dispersion cooling method such as that disclosed in Great Britain Patents No. 952,807 and 965,074.

As the microcapsule wall-forming material, any inorganic or organic materials, as long as microcapsule walls can be made therefrom in the aforementioned capsule manufacturing methods, can be used. The microcapsule wall-forming material is preferably to exhibit excellent light-transmissive.

Specific examples of the microcapsule wall-forming material include gelatin, gum arabic, starch, sodium alginate, polyvinyl alcohol, polyethylene, polyamides, polyester, polyurethane, polyurea, polystyrene, nitrocellulose, ethylcellulose, methylcellulose, melamine-formaldehyde resins, urea-formaldehyde resins, and the like, as well as copolymers thereof.

Melamine-formaldehyde resins or urea-formaldehyde resins, which can be produced in a relatively simple manufacturing method, are preferred when the in-situ method is used, in which the wall starting material is supplied in water.

When the microcapsules are thus manufactured, the composition serving as the encapsulation material must be dispersed or emulsified in an aqueous medium. At this time, the aqueous medium should contain a nonionic or anionic water-soluble polymer.

Examples of nonionic water-soluble polymers include polyvinyl alcohol, polyvinyl pyrrolidone, polyacrylamide, polymethylvinyl ether, hydroxymethylcellulose, and hydroxyethylcellulose.

Examples of anionic water-soluble polymers include polystyrenesulfinic acid, polystyrenesulfonates, styrenesulfonic acid copolymers, polyvinyl sulfuric acid ester salts, polyvinylsulfonates, maleic anhydride-styrene copolymers, and maleic anhydride-isobutylene copolymers.

Examples of materials used as the recording medium for the photosensitive recording material of the present invention include paper, high grade paper, coated paper and other types of paper; films and resins such as polyester, polyethylene, polypropylene, cellulose acetate, cellulose ester, polyvinyl acetal, polystyrene, polycarbonate, polyethylene terephthalate, or polyimide; and synthetic paper or the like comprising paper and resin. Of these, films are preferred because they have excellent surface smoothness, strength, and the like, and because they are thin, with a thickness of not more than 0.05 mm and they therefore have a relatively small volume area when rolled. Forming a reflection layer by aluminum deposition or the like on at least one side of the film is effective for improving the photosensitivity of the photosensitive recording material.

A hydrophilic binder is mixed in the microcapsule dispersed liquid to form a photosensitive layer by applying the microcapsules on the aforementioned recording medium. Natural substances such as gelatin, cellulose, starch, and gum arabic, or synthetic polymers such as polyvinyl alcohol, polyvinyl pyrrolidone, polyacrylic acid, polymethacrylic acid, polyacrylamide, polyvinyl imidazole, and polystyrenesulfonic acid may be used as the hydrophilic binder.

EXAMPLES

The present invention will be illustrated in further detail below through the following working examples. The present invention should not be limited to the examples.

Examples 1 to 3 and Comparative Example 1

A photosensitive recording material using microcapsules containing a phosphine compound with the following composition and a photosensitive recording material using microcapsules containing no phosphine compound were applied to the surface of polyester sheets.

The materials were exposed and hardened using a spectral sensitivity meter, and were then overlaid with image-receiving paper and pressurized.

The hardening energy was measured based on the extent of hardness at the maximum image hardness wavelength, the radiating energy from the light source at that wavelength, and the exposure time, and the obtained value was considered an index of hardness.

Encapsulation Material for Microcapsule (a) photopolymerizable unsaturated group-containing compound (1:1 blend) 100 parts by weight dipentaerythritol polyacrylate phenyl glycidyl ether acrylate (b) photopolymerization initiator 4 parts by weight iron arene complex (c) wavelength sensitizing dye 0.3 parts by weight squarilium dyes (d) sensitizing dye 1.5 parts by weight 2,6-diisopropyl-N,N-dimethylaniline (e) phosphine compound 4 parts by weight The results are given in Table 1.

TABLE 1

| Composition No. | Phosphine compound | (Exposure light-wavelength: 650 nm) Hardening energy (erg · cm$^{-2}$) |
|---|---|---|
| Example 1 | trilauryl thiophosphite | 2,000 |
| Example 2 | triphenylphosphine | 5,200 |
| Example 3 | triphenylphosphite | 3,300 |
| Comparative Example 1 | none added | 10,000 |

The phosphine compounds used in the examples 1 to 3 shown in Table 1 above are given below.

In the phosphine compound of the aforementioned general formula in Example 1, $R^1$, $R^2$, and $R^3$ are all —$SR^4$, and $R^4$ is a $C_{12}$ straight-chain alkyl group. In the phosphine compound in Example 2, $R^1$, $R^2$, and $R^3$ are all $C_6$ aryl groups.

In the phosphine compound in Example 3, $R^1$, $R^2$, and $R^3$ are all —$OR^4$, and $R^4$ is a $C_6$ aryl group.

The results in Table 1 show that Examples 1 to 3, in which a phosphine compound was used, had lower exposure energy levels and faster hardening velocities than Comparative Example 1, in which no phosphine compound was contained.

The photosensitive recording materials in which the photopolymerizable unsaturated group-containing compound contained a phosphine compound can thus be said to be more sensitive to light and to have good hardening properties.

As is clear in the description above, the photosensitive recording material of the present invention allows the microcapsules to be sufficiently hardened with low energy, and clear images to be formed with good tone and no smearing.

The photosensitive recording material of the present invention, in which the photopolymerizable unsaturated group-containing compound is a polymerizable compound containing at least one ethylenic unsaturated double bond, allows the microcapsules to be sufficiently hardened rapidly, and clear images to be formed with good tone and no smearing.

The photosensitive recording material of the present invention, in which the phosphine compound is present in an amount of from about 0.01 to 20 wt %, allows the microcapsules to be sufficiently hardened in a rapid manner with low energy, and clear images to be formed with good tone and no smearing.

The entire disclosure of the specification, claims and summary of Japanese Patent Application No. 9-130813 filed on May 21, 1997 is herein incorporated by reference in its entirety.

What I claim is:

1. A photosensitive recording material comprising a support and microcapsules provided thereon, wherein the microcapsules comprise a photopolymerizable unsaturated group-containing compound and a phosphine compound represented by the following general formula:

where $R^1$, $R^2$ and $R^3$ indicate a hydrogen atom, a $C_1$ to $C_{20}$ alkyl, aryl or aralkyl group, —$OR^4$, or —$SR^4$ where $R^4$ indicates a hydrogen atom or a $C_1$ to $C_{20}$ alkyl, aryl or aralkyl group, and these may be substituted by a halogen atom or a $C_1$ to $C_{20}$ alkoxy, alkoxycarbonyl, acyloxy, alkanoyl, cyano, hydroxy or amino group; wherein the phosphine compound includes at least one thiophosphite derivative and the microcapsules contain a sensitizing colorant as a photosensitizer.

2. The photosensitive recording material according to claim 1, wherein said photopolymerizable unsaturated group-containing compound is a polymerizable compound having at least one ethylenic unsaturated double bond.

3. The photosensitive recording material according to claim 2, wherein the polymerizable compound having at least one ethylenic unsaturated double bond is selected from acrylic acid and salts thereof, acrylic acid esters, acrylamide, methacrylic acid and salts thereof, methacrylic acid esters, methacrylamides, maleic anhydride, maleic anhydride esters, itaconic acid esters, styrenes, vinyl ethers, vinyl esters, N-vinyl heterocycles, allyl ethers, allyl esters, and derivatives thereof.

4. The photosensitive recording material according to claim 3, wherein the polymerizable compound having at least one ethylenic unsaturated double bond is selected from acrylic acid esters and methacrylic acid esters.

5. The photosensitive recording material according to claim 4, wherein the acrylic acid ester is selected from butyl acrylate, cyclohexyl acrylate, ethylhexyl acrylate, benzyl acrylate, furfuryl acrylate, ethoxyethyl acrylate, tricyclodecanyloxy acrylate, nonylphenyloxyethyl arylate, hexanediol acrylate, 1,3-dioxolan acrylate, hexanediol diacrylate, butanediol diacrylate, neopentyl glycol diacrylate, polyethylene glycol diacrylate, tricyclodecane dimethylol diacrylate, tripropylene glycol diacrylate, bisphenol A diacrylate, pentaerythritol triacrylate, dipentaerythritol hexacrylate, dipentaerythritol caprolactone-adduct hexacrylate, trimethylol propane triacrylate, trimethylol propane propylene oxide-adduct triacrylate, polyoxyethylenated bisphenol A diacrylate, polyester acrylate, and polyurethane acrylate.

6. The photosensitive recording material according to claim 4, wherein the methacrylic acid ester is selected butyl methacrylate, cyclohexyl methacrylate, ethylhexyl methacrylate, benzyl methacrylate, furfuryl methacrylate, ethoxyethyl methacrylate, tricyclodecanyloxy methacrylate, nonylphenyloxyethyl methacrylate, hexanediol methacrylate, 1,3-dioxolan methacrylate, hexanediol dimethacrylate, butanediol dimethacrylate, neopentyl glycol dimethacrylate, polyethylene glycol dimethacrylate, tricyclodecane dimethylol dimethacrylate, tripropylene glycol dimethacrylate, bisphenol A dimethacrylate, pentaerythritol trimethacrylate, dipentaerythritol hexamethacrylate, dipentaerythritol caprolactone-adduct hexamethacrylate, trimethylol propane trimethacrylate, trimethylol propane propylene oxide-adduct trimethacrylate, polyoxyethylenated bisphenol A dimethacrylate, polyester methacrylate, and polyurethane methacrylate.

7. The photosensitive recording material according to claim 4, wherein the polymerizable compound having at least one ethylenic unsaturated double bond contains at least one of pentaerythritol triacrylate, dipentaerythritol hexacrylate, dipentaerythritol caprolactone-adduct hexacrylate, trimethylol propane triacrylate, and trimethylol propane propylene oxide-adduct triacrylate.

8. The photosensitive recording material according to claim 1, wherein said phosphine compound is contained in an amount of from about 0.01 to 20 wt %.

9. The photosensitive recording material according to claim 8, wherein said phosphine compound is contained in an amount of from about 0.5 to 10 wt %.

10. The photosensitive recording material according to claim 1, wherein in addition to said thiophosphite derivative said phosphine compound is selected from phosphate esters, phosphite esters, thiophosphate esters, thiophosphite esters, and derivatives thereof.

11. The photosensitive recording material according to claim 1, wherein the microcapsules contain a photopolymerization initiator.

12. The photosensitive recording material according to claim 11, wherein the photopolymerization initiator is selected from aromatic carbonyl compounds, acetophenones, organic peroxides, diphenylhalonium salts, organic halides, 2,4,6-substituted-S-triazines, 2,4,5-triarylimidazole dimers, azo compounds, dye borate complexes, metal arene complexes, and titanocene compounds.

13. The photosensitive recording material according to claim 12, wherein the photopolymerization initiator is selected from benzophenone, benzil, xanthone, thioxanthone, anthraquinone, acetophenone, 2,2-dimethl-2-morpholino-4'-methylthioacetophenone, benzoyl peroxide, 3,3',4,4'-tetrakis(t-butyldioxycarbonyl)benzophenone, diphenyl iodonium bromide, diphenyl iodonium chloride, carbon tetrachloride, carbon tetrabromide, 2,4,6-tristrichloromethyl-S-triazine, and ($\eta^5$-2,4-cyclopentadien-1-yl)[(1,2,3,4,5,6-$\eta$)-(1-ethylethyl)benzene]iron(1+) hexafluorophosphate(1–).

14. The photosensitive recording material according to claim 11, wherein the microcapsules contains a photopolymerization initiator in an amount of 0.1 to 20 wt %.

15. The photosensitive recording material according to claim 14, wherein the microcapsules contains a photopolymerization initiator in an amount of 1 to 10 wt %.

16. The photosensitive recording material according to claim 11, wherein the photopolymerization initiator is a metal arene complex.

17. The photosensitive recording material according to claim 1, wherein the sensitizing colorant is selected from xanthene dyes, coumarin dyes, mellocyanine dyes, thiazine dyes, azine dyes, methine dyes, oxazine dyes, phenylmethane dyes, cyanine dyes, azo dyes, anthraquinone dyes, pyrazoline dyes, stilbene dyes, and quinoline dyes.

18. A photosensitive recording material comprising a support and microcapsules provided thereon, wherein the microcapsules comprise a photopolymerizable unsaturated group-containing compound, a photopolymerization initiator and a phosphine compound represented by the following general formula:

where $R^1$, $R^2$ and $R^3$ indicate a hydrogen atom, a $C_1$ to $C_{20}$ alkyl, aryl or aralkyl group, —$OR^4$, or —$SR^4$ where $R^4$ indicates a hydrogen atom or a $C_1$ to $C_{20}$ alkyl, aryl or aralkyl group, and these may be substituted by a halogen atom or a $C_1$ to $C_{20}$ alkoxy, alkoxycarbonyl, acyloxy, alkanoyl, cyano, hydroxy or amino group; wherein the phosphine compound includes at least one thiophosphite derivative and the photopolymerization initiator is a metal arene complex.

19. A photosensitive recording material comprising a support and microcapsules provided thereon, wherein the microcapsules comprise a photopolymerizable unsaturated group-containing compound and a phosphine compound represented by the following general formula:

where $R^1$, $R^2$ and $R^3$ indicate a hydrogen atom, a $C_1$ to $C_{20}$ alkyl, aryl or aralkyl group, —$OR^4$, or —$SR^4$ where $R^4$ indicates a hydrogen atom or a $C_1$ to $C_{20}$ alkyl, aryl or aralkyl group, and these may be substituted by a halogen atom or a $C_1$ to $C_{20}$ alkoxy, alkoxycarbonyl, acyloxy, alkanoyl, cyano, hydroxy or amino group; wherein the phosphine compound includes at least one thiophosphite derivative.

* * * * *